United States Patent
Kamano

(10) Patent No.: US 10,255,988 B2
(45) Date of Patent: Apr. 9, 2019

(54) SEMICONDUCTOR MEMORY DEVICE AND METHOD FOR TESTING SEMICONDUCTOR MEMORY DEVICE

(71) Applicant: LAPIS SEMICONDUCTOR CO., LTD., Kanagawa (JP)

(72) Inventor: Shuhei Kamano, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/939,443

(22) Filed: Mar. 29, 2018

(65) Prior Publication Data
US 2018/0286496 A1 Oct. 4, 2018

(30) Foreign Application Priority Data

Apr. 4, 2017 (JP) .................. 2017-074815

(51) Int. Cl.
| | |
|---|---|
| *G11C 29/50* | (2006.01) |
| *G11C 11/401* | (2006.01) |
| *G11C 29/02* | (2006.01) |
| *G11C 29/24* | (2006.01) |

(52) U.S. Cl.
CPC ...... *G11C 29/50012* (2013.01); *G11C 11/401* (2013.01); *G11C 29/028* (2013.01); *G11C 29/24* (2013.01)

(58) Field of Classification Search
CPC ............ G11C 29/50012; G11C 11/401; G11C 29/028; G11C 29/24

USPC ............................................ 365/201, 185.03
See application file for complete search history.

(56) References Cited

U.S. PATENT DOCUMENTS

| | | | | |
|---|---|---|---|---|
| 2002/0093032 A1* | 7/2002 | Hanzawa | ................. | G11C 7/14 |
| | | | | 257/200 |
| 2010/0020589 A1* | 1/2010 | Doumae | ................. | G11C 7/14 |
| | | | | 365/145 |

FOREIGN PATENT DOCUMENTS

| | | |
|---|---|---|
| JP | H10308100 A | 11/1998 |
| JP | H11353898 A | 12/1999 |
| JP | 2012014799 A | 1/2012 |

* cited by examiner

*Primary Examiner* — Vu A Le
(74) *Attorney, Agent, or Firm* — Volentine, Whitt & Francos, PLLC

(57) ABSTRACT

A semiconductor memory device includes: a memory cell including a first cell that stores data, and a second cell that stores complementary data that is complementary to the data; a redundant memory cell including a third cell that stores margined complementary data in which a margin is added to the complementary data, and a fourth cell that stores margined data in which a margin is added to the data; and a controller that causes the data and the margined complementary data to be compared and a test of the first cell to be executed, and the complementary data and the margined data to be compared and a test of the second cell to be executed.

5 Claims, 5 Drawing Sheets

SEMICONDUCTOR MEMORY DEVICE AND METHOD FOR TESTING SEMICONDUCTOR MEMORY DEVICE

CROSS-REFERENCE TO RELATED APPLICATION

This application claims priority under 35 USC 119 from Japanese Patent Application No. 2017-074815, filed on Apr. 4, 2017, the disclosure of which is incorporated by reference herein.

BACKGROUND

Technical Field

The present disclosure relates to a semiconductor memory device and a method for testing a semiconductor memory device that include a test circuit in which a data read margin is considered.

Related Art

Conventionally, Japanese Patent Application Laid-Open (JP-A) No. H10-308100 discloses a semiconductor memory device mainly focusing on a testing method. The semiconductor memory device disclosed in JP-A No. H10-308100 includes a shared sense amplifier type DRAM that connects a pair of first and second bit lines to one sense amplifier, and, in a test mode, controls the connections of the first and second bit lines as follows. In a process of reading data from a memory cell, by changing a newly added test control signal ZWLF from "H" to "L" before a word line WL0 is selected, a signal S1U that controls connection of the second bit line pair is set to "H", and the pair of second bit line, which is not used in normal operation, is also connected to the sense amplifier. Due thereto, the word line WL0 is selected in a state in which bit line capacity is made twice the normal operation, and data is read from a predetermined cell. In JP-A No. H10-308100, due to the above configuration, data may not be correctly read, in a case in which a cell capacity margin is insufficient.

Further, a ferroelectric memory device disclosed in JP-A No. H11-353898 includes a ferroelectric capacitor, a read line connected to one end of the ferroelectric capacitor and having a floating capacitor, and a test capacitor that is connectable to the read line in parallel with the floating capacitor. The ferroelectric memory device performs screening, in a state in which the test capacitor is connected to the read line, applying a voltage to the other end of the ferroelectric capacitor and detecting a potential generated in the read line.

Further, as a test method of a semiconductor memory device including memory cells having a pair of transistors, a testing method disclosed in JP-A No. 2012-014799 is known. This semiconductor nonvolatile memory circuit includes: a pair of first transistor and a second transistor forming a memory cell; a sense amplifier SA that generates an output signal of a logic level according to a high-low relationship between a first on-current I1 flowing through the first transistor and a second on-current I2 flowing through the second transistor; and a test circuit TEST that individually controls whether or not to give an offset to the first on-current I1 and whether or not to give an offset to the second on-current I2.

In a semiconductor memory device (semiconductor memory) configured such that data is complementarily stored in two memory cells ("read target cell" and "complementary cell"), and data is determined by comparing the two stored data with each other, there is a need to preliminarily and quantitatively test whether the two memory cells do not have potential faults or have sufficient margins when reading. Note that, hereinbelow, "read target cell" and "complementary cell" may be collectively referred to as "unit cell".

With respect to the above, both JP-A No. H10-308100 and JP-A No. H11-353898 discloses a testing method in which a read operation margin test is performed in a semiconductor memory that stores data by using two unit cells. In the testing method according to JP-A No. H10-308100, in a read operation margin test, the test is performed under a more severe condition by adding a test memory cell to a bit line and a paired bit line to increase load capacitance and reduce a read voltage. In the testing method according to JP-A No. H11-353898, in a read operation margin test, the test is performed under a more severe condition by adding to a read target a non-selected bit line of other than the read target to increase load capacitance.

However, the testing method disclosed in JP-A No. H10-308100 and JP-A No. H11-353898 are testing method for performing a margin test by increasing the load capacitance and reducing the read voltage by adding a test memory cell or a non-selected memory cell bit line to the bit line and the paired bit line, in the semiconductor memory that stores data by using two unit cells. Namely, in the above margin test, an operation margin is tested by applying heavier capacitive load than in normal reading, and the above margin test is not a testing method for testing the margin in read operation in a quantitative manner.

The testing method of the semiconductor nonvolatile memory circuit disclosed in JP-A No. 2012-014799 is capable of quantitatively testing the margin under certain restrictions. Namely, in the testing method disclosed in JP-A No. 2012-014799, an offset current is given to an unit cell at less on-current side (data "0" side), and a sum current of the unit cell and an on-current of an unit cell at more on-current side (data "1" side) are compared by the sense amplifier. Accordingly, the testing method disclosed in JP-A No. 2012-014799 may indirectly perform a test of the unit cell at the more on-current side in a quantitative manner with a certain extent. However, since offset may only be added, in the above method, it is not possible to perform a quantitative test to the unit cell at the less on-current side.

More specifically, in the testing method disclosed in JP-A No. 2012-014799, since a difference in on-current are compared, for example, in cases in which on-currents in a combination of data 0 and 1 are 0 µA and 5 µA, or are 100 µA and 105 µA, the above testing method passes the both cases. Namely, the above testing method may not distinguish combinations having the same current difference in the combination of data 0 and 1.

Further, in the testing method disclosed in JP-A No. 2012-014799, a redundant memory cell is provided for giving the offset current in a memory cell block. However, the redundant memory cell functions as the load capacitance in normal read operation. Due thereto, in the testing method disclosed in JP-A No. 2012-014799, the load at the time of read operation may become heavy and access may become slow.

In a case in which a redundant memory cell is added to the semiconductor memory device for a margin test, it may be convenient if the redundant memory cell can also be used as a backup cell. The backup cell is a non-defective memory cell for replacing a defective memory cell, in a case in which the defective cell is detected in, for example, an inspection of the semiconductor memory device. In this respect, in the semiconductor nonvolatile memory circuit disclosed in JP-A No. 2012-014799, the word line for the redundant memory cell is configured as a dedicated word line which is different from the word line of the memory cells, and thus, the redundant memory cell cannot be used as the backup cell.

SUMMARY

The present disclosure, in a semiconductor memory device including memory cells that complementarily store data in a pair of cells, provides a semiconductor memory device and a testing method of a semiconductor memory device that includes a test circuit that may test, with taking into account of a margin, whether there is an abnormality in each cell, that may suppress load influence on the memory cell, and that may function as a backup of the memory cell.

A first aspect of the present disclosure is a semiconductor memory device including: a memory cell including a first cell that stores data, and a second cell that stores complementary data that is complementary to the data; a redundant memory cell including a third cell that stores margined complementary data in which a margin is added to the complementary data, and a fourth cell that stores margined data in which a margin is added to the data; and a controller that causes the data and the margined complementary data to be compared and a test of the first cell to be executed, and the complementary data and the margined data to be compared and a test of the second cell to be executed.

A second aspect of the present disclosure is a testing method of a semiconductor memory device, the semiconductor memory device including: a memory cell including a first cell that stores data and a second cell that stores complementary data that is complementary to the data; and a redundant memory cell including a third cell that stores margined complementary data in which a margin is added to the complementary data, and a fourth cell that stores margined data in which a margin is added to the data, the method including: causing, by a controller, the data and the margined complementary data to be compared and a test of the first cell to be executed, and the complementary data and the margined data to be compared and a test of the second cell to be executed.

According to the above aspects, in a semiconductor memory device including memory cells that complementarily store data in a pair of cells, the present disclosure may provide a semiconductor memory device and a testing method of a semiconductor memory device that includes a test circuit that may test, with taking into account of a margin, whether or not there is an abnormality in each cell, that may suppress load influence on the memory cell, and that may function as a backup of the memory cell.

BRIEF DESCRIPTION OF THE DRAWINGS

Exemplary embodiments will be described in detail based on the following figures, wherein.

DETAILED DESCRIPTION

Hereinafter, embodiments of the disclosure will be described in detail with reference to the drawings.

First Exemplary Embodiment

With reference to FIGS. 1 to 4, a semiconductor memory device and a testing method of the semiconductor memory device according to a present exemplary embodiment will be described. The semiconductor memory device and the testing method of the semiconductor memory device according to the present exemplary embodiment include a semiconductor memory that performs expected value determination by a sense amplifier by comparing two unit cells. The semiconductor memory is configured such that a margin test can be individually performed for the two unit cells, and configured such that a difference in voltage (or current) can be quantitatively tested with high accuracy. Namely, a memory cell including two unit cells that each stores data, are compared with, a redundant cell including two unit cells that stores data. The data stored in the redundant cell is data in which the data stored in the memory cell is applied with a margin. The present testing method determines based on the compared result, and thus, the margin test may be performed in quantitative manner.

Here, the term "margin" in the present exemplary embodiment means a physical quantity that becomes disadvantageous in determination when add to or subtract from each complementary value, in a case in which a logical value of "1" or "0" is compared with each complementary value ("0" for "1", "1" for "0"). For example, it is assumed a case in which a read current flowing when an expected value (a logical value predicted in a test target memory cell) "0" is 0 A, and a read current flowing in the case of an expected value "1" is 100 µA. In this case, when a comparison target for the expected value "0" is 80 µA, for example, a margin $\alpha$ is $\alpha=20$ µA. In addition, when a comparison target for the expected value "1" is 30 µA, the margin $\alpha$ in this case is $\alpha=30$ µA. Hereinafter, "1" as a comparison target is expressed as "1–$\alpha$" including the margin, and "0" as a comparison target is expressed as "0+$\alpha$" including the margin.

Figure 1:
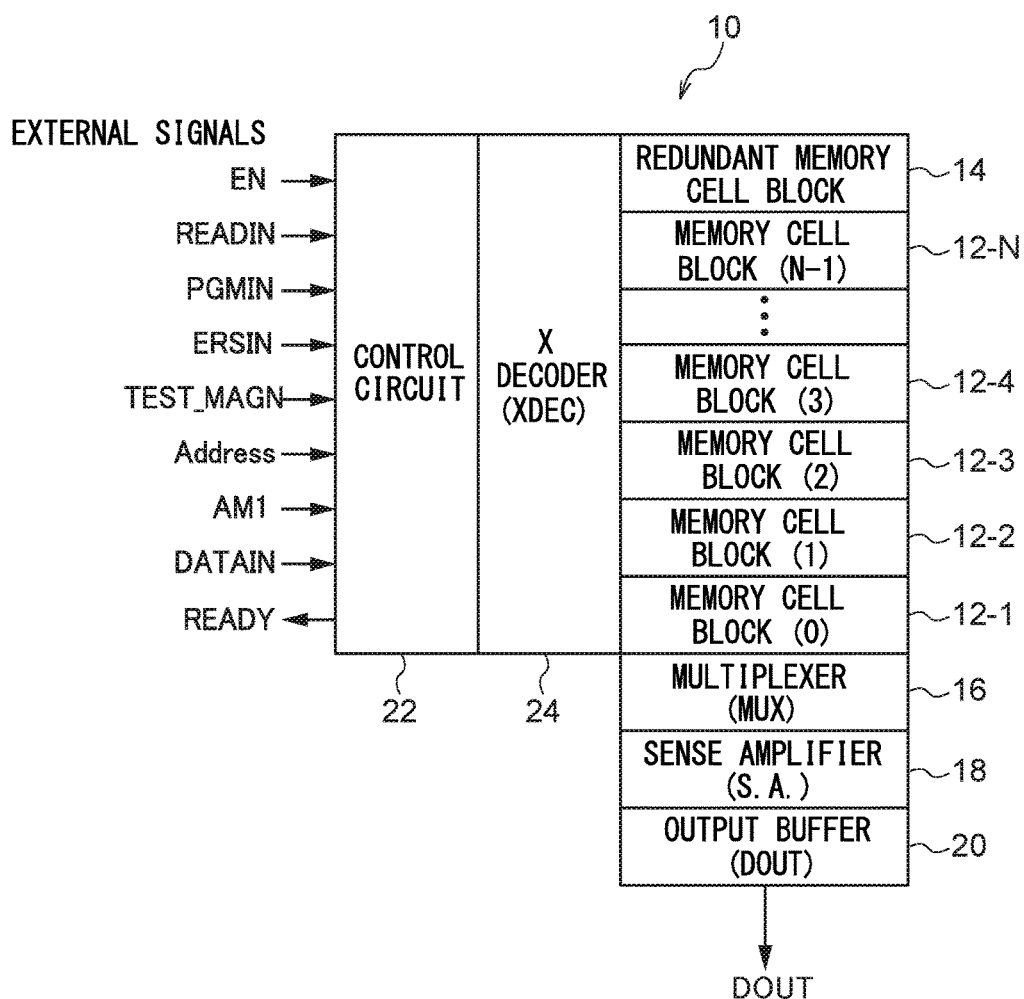
FIG. 1 is a block diagram illustrating a configuration of a semiconductor memory device according to an exemplary embodiment.

As illustrated in FIG. 1, a semiconductor memory device (semiconductor memory) 10 according to the present exemplary embodiment includes a plurality of memory cell blocks (FIG. 1 illustrates an example of N blocks) including a memory cell block (0) 12-1, a memory cell block (1) 12-2, a memory cell block (2) 12-3, a memory cell block (3) 12-4, . . . , and a memory cell block (N–1) 12-N (hereinafter, may be collectively referred as "memory cell block 12"). Further, the semiconductor memory device (semiconductor memory) 10 according to the present exemplary embodiment includes: a redundant memory cell block 14; a multiplexer (MUX) 16; a sense amplifier (S.A.) 18; an output buffer 20; a control circuit 22; and an X decoder (XDEC) 24.

The memory cell block 12 is a block in which a plurality of memory cells 30 (see FIG. 2) for storing user data is arranged. The memory cell 30 according to the present exemplary embodiment includes a "read target cell" and a "complementary cell" that complementarily store data. The redundant memory cell block 14 is a block in which one or more redundant memory cells 40 (see FIG. 2), that are used in the case of executing the testing method of the semiconductor memory device according to the present exemplary embodiment (hereinafter, "the testing method"), are arranged. In the semiconductor memory device 10 according to the present exemplary embodiment, a cell having the same configuration as the memory cell 30 is used as the redundant memory cell 40. However, the present disclosure is not limited thereto, and a redundant memory cell having different configuration from the memory cell 30 may be used, as long as functions described below is fulfilled. Details of the memory cell 30 and the redundant memory cell 40 will be described later.

In normal reading of user data, the control circuit 22 generates a decode signal for a word line (WLx), a decode signal for a read selection line (RLx), a decode signal for a multiplexer (YAx), and the like, in accordance with an input address. In addition, in the present testing method, the control circuit 22 generates a decode signal by applying a logic conversion to the input address via a test signal TEST_MAGN (a selection signal is generated by decoding the decode signal), and controls such that the "read target cell" of the memory cell 30 is compared with the "complementary cell" of the redundant memory cell 40, or such that the "complementary cell" of the memory cell 30 is compared with the "read target cell" of the redundant memory cell 40. In other words, the control circuit 22 controls such that the "complementary cell" of the memory cell 30 is replaced with the "complementary cell" of the redundant memory cell, and the "read target cell" of the memory cell 30 is replaced with the "read target cell" of the redundant memory cell.

The X decoder 24 receives the decode signal, and controls the word line (WLx) and selection/non-selection of the read selection line (RLx). In execution of the present testing method, the redundant memory cell 40 is also selected at the same time.

The multiplexer 16 receives the decode signal, and controls selection/non-selection of the multiplexer (YAx) and selection/non-selection of a bit line (BLx). The selected bit line (BLx) is connected to the sense amplifier 18. In execution of the present testing method, the bit line (BLx) connected to the redundant memory cell 40 is selected by the decode signal.

In a case in which the selected memory cell 30 (the read target cell and the complementary cell) is input, the sense amplifier 18 determines the expected value (determines whether the data stored in the unit cell is "0" or "1" on the basis of a difference between input signals). On the other hand, in execution of the present testing method, the data stored in one of the two unit cells of the memory cell 30 switched by the multiplexer 16, and the data stored in one unit cell of the corresponding redundant memory cell 40, are compared with each other, and the expected value determination is performed.

The output buffer 20 finally outputs, to the outside, information of the expected value determination by the sense amplifier 18.

Next, signals input to the control circuit 22 or output from the control circuit 22 will be described. An EN signal illustrated in FIG. 1 is a device selection signal (enable signal). A READIN signal (read-in signal) is a signal indicating read timing of the memory cell 30 and the redundant memory cell 40. A PGMIN signal (program-in signal) is a signal for controlling input of a program and the like of the testing method. An ERSIN signal (erase-in signal) is a signal for controlling erasing of the program and the like of the testing method input.

The TEST_MAGN signal (test margin signal) is a signal for controlling timing of executing the testing method. An Address signal (address signal) is a signal for designating an address of the memory cell 30. An AM1 signal is a signal specifying a combination of the unit cell of the memory cell 30 and the unit cell of the redundant memory cell 40 in the testing method. In the present testing method, the "read target cell" of the memory cell 30 and the "complementary cell" of the redundant memory cell 40, or the "complementary cell" of the memory cell 30 and the "read target cell" of the redundant memory cell 40 are combined. A DATAIN signal is a signal indicating data to be stored in the semiconductor memory device 10. A READY signal is a signal indicating, to the outside, that the semiconductor memory device 10 is waiting for a signal input.

Figure 2:
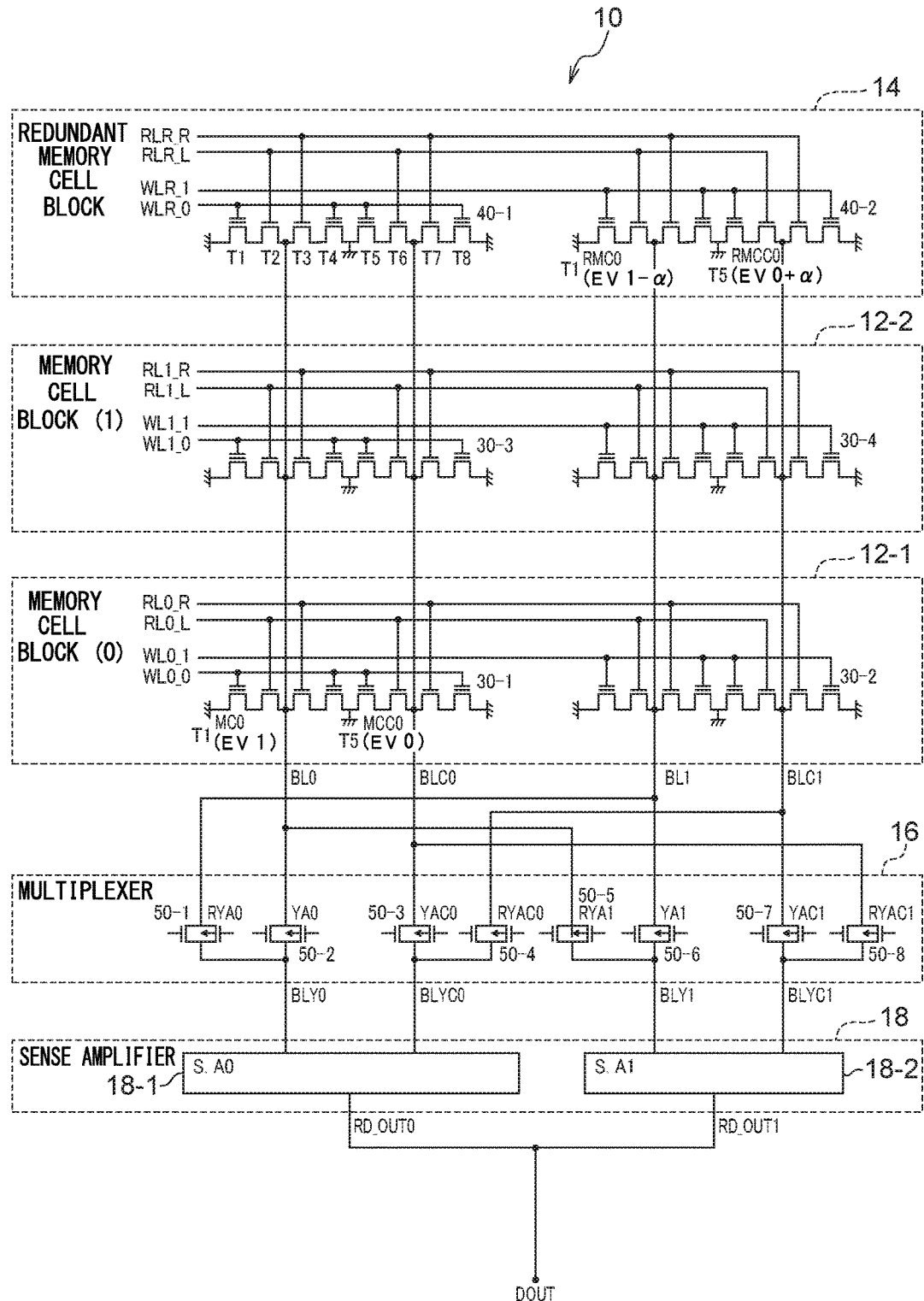
FIG. 2 is a circuit diagram illustrating a configuration of a semiconductor memory device according to a first exemplary embodiment.

A specific circuit of the semiconductor memory device 10 according to the present exemplary embodiment will be described with reference to FIG. 2. FIG. 2 illustrates, among the configuration of the semiconductor memory device 10, the memory cell block (0) 12-1, the memory cell block (1) 12-2, the redundant memory cell block 14, the multiplexer 16 and the sense amplifier 18. The number of the memory cell blocks 12 is not limited to two, and an appropriate number of the memory cell blocks 12 are provided in accordance with the memory capacity and the like, of the semiconductor memory device 10.

In FIG. 2, among the plurality of memory cells configuring the memory cell block (0), a memory cell 30-1 and a memory cell 30-2 (in the case of being collectively referred to, "memory cell 30") are extracted and illustrated. Similarly, among the plurality of memory cells configuring the memory cell block (1), a memory cell 30-3 and a memory cell 30-4 are extracted and illustrated.

In FIG. 2, among the redundant memory cells configuring the redundant memory cell block 14, a redundant memory cell 40-1 and a redundant memory cell 40-2 (in the case of being collectively referred to, "redundant memory cell 40") are extracted and illustrated. As illustrated in FIG. 2, in the present exemplary embodiment, the same circuit as the memory cell 30 is used as a circuit of the redundant memory cell 40.

As illustrated in FIG. 2, the memory cells 30-1 and 30-3, and the redundant memory cell 40-1 are connected by common bit lines BL0 and BLC0. The memory cells 30-2 and 30-4, and the redundant memory cell 40-2 are connected by common bit lines BL1 and BLC1. Namely, in FIG. 2, two series of memory cell columns are illustrated. The number of the columns is not limited to two, and an appropriate number of the columns are provided in accordance with the memory capacity and the like, of the semiconductor memory device 10. Hereinafter, for convenience, the column of the memory cells 30-1 and 30-3, and the redundant memory cell 40-1 is referred to as "0 series memory", and the column of the memory cells 30-2 and 30-4, and the redundant memory cell 40-2 is referred to as "1 series memory".

Figure 3:
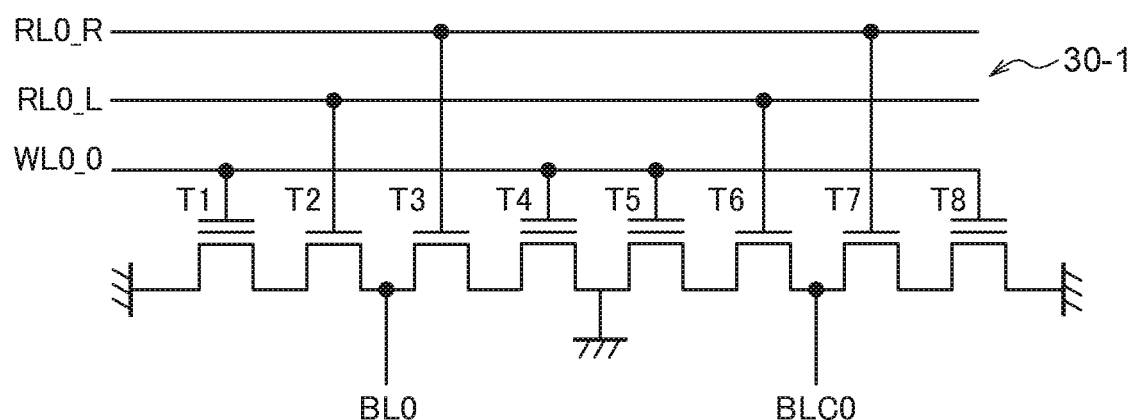
FIG. 3 is a circuit diagram illustrating a configuration of a memory cell of the semiconductor memory device according to the present exemplary embodiment.

With reference to FIG. 3, the configuration of the memory cell 30 according to the present exemplary embodiment will be described in more detail. Note that FIG. 3 illustrates the memory cell 30-1; however, other memory cells 30 and redundant memory cells 40 have the same configuration. As illustrated in FIG. 3, the memory cell 30-1 is a 2-bit type memory cell including Metal Oxide Semiconductor (MOS) type transistors T1, T2, T3, T4, T5, T6, T7, and T8. The transistors T1 to T8 each may be an N-type or a P-type, but in the present exemplary embodiment, the N-type is used. Note that, in the present exemplary embodiment, the 2-bit memory cell is used to further improve the reliability in data retention.

The transistors T1, T4, T5, and T8 are floating gate type transistors, and each transistor is made to correspond to the logical value "0" (hereinafter "expected value 0") by injection of electrons (hot carriers) into the floating gate, and is made to correspond to the logical value "1" (hereinafter, "expected value 1") by no injection of electrons. This correspondence is an example, and the correspondence may be reversed.

In the present exemplary embodiment, the transistors T1 and T5 are paired to configure the read target cell and the complementary cell, and the transistors T4 and T8 are paired to configure the read target cell and the complementary cell. The transistor T2 is a selection transistor that causes the current from the transistor T1 to flow through the bit line BL0. Similarly, the transistor T3 is a selection transistor that causes the current from the transistor T4 to flow through the bit line BL0. The transistor T6 is a selection transistor that causes the current from the transistor T5 to flow through the bit line BLC0. The transistor T7 is a selection transistor that causes the current from the transistor T8 to flow through the bit line BLC0.

The gates of the transistors T1, T4, T5 and T8 are connected to a common word line WL0_0, the gates of the transistors T2 and T6 are connected to a common read selection line RL0_L, and the transistors T3 and T7 are connected to a common read selection line RL0_R. The drain of each of the transistors T1, T4, T5, and T8 is connected to the ground. In the memory cell 30-1 having the above configuration, for example, by applying a positive potential to the word line WL0_0 and the bit line BL0, electrons are injected into the transistor T1 to bring a state of the expected value 0, and the transistor T5 is brought into a state of the expected value 1. In the case of reading, by applying a positive potential to the read selection line RL0_L, a current according to a state of the transistor T1 flows through the bit line BL0, and a current according to a state of the transistor T5 flows through the bit line BLC0.

In FIG. 2, among plural transfer gates configuring the multiplexer 16, transfer gates 50-1, 50-2, 50-3, 50-4, 50-5, 50-6, 50-7, and 50-8 are illustrated. In FIG. 2, the transfer gates 50-1 and 50-2 configure a first transfer gate pair. Similarly, the transfer gates 50-3 and 50-4 configure a second transfer gate pair, the transfer gates 50-5 and 50-6 configure a third transfer gate pair, and the transfer gates 50-7 and 50-8 configure a fourth transfer gate pair.

As illustrated in FIG. 2, the bit line BL1 is connected to the transfer gate 50-1, the bit line BL0 is connected to the transfer gate 50-2. One of the bit lines BL1 and BL0 is exclusively selected by the first transfer gate pair, and a signal on a selected side is output to a main bit line BLY0. Similarly, one of the bit lines BLC0 and BLC1 is exclusively selected by the second transfer gate pair, and a signal on a selected side is output to a main bit line BLYC0. Further, one of the bit lines BL0 and BL1 is exclusively selected by the third transfer gate pair and a signal on a selected side is output to a main bit line BLY1. Furthermore, one of the bit lines BLC1 and BLC0 is exclusively selected by the fourth transfer gate pair, and a signal on a selected side is output to a main bit line BLYC1.

In the following description, a signal generated on a line X is denoted a signal <X>. For example, a signal generated on the bit line BL0 is denoted as a signal <BL0>.

As illustrated in FIG. 2, the sense amplifier 18 is configured including a sense amplifier 18-1 (S.A0) that correspond to the 0 series memory, and a sense amplifier 18-2 (S.A1) that correspond to the 1 series memory. The sense amplifier 18-1 calculates a difference between signals <BLY0> and <BLYC0>, and outputs a result to an output line RD_OUT0. In addition, the sense amplifier 18-2 calculates a difference between signals <BLY1> and <BLYC1>, and outputs a result to an output line RD_OUT1. One of output signals <RD_OUT0> and <RD_OUT1> is output from an output terminal DOUT, as an output signal <DOUT>.

The semiconductor memory device 10 according to the present exemplary embodiment having the above configuration has the following features.

(1) In addition to a region of the memory cell 30 for storing the user data, the redundant memory cell 40 is provided storing the data for comparison with the memory cell 30 in the operation of the margin test according to the present testing method. The complementary cell and the read target cell of the redundant memory cell 40 are configured to correspond to the read target cell and the complementary cell that are the unit cells of the memory cell 30, and are compared, whereby the operation margin of the memory cell 30 is tested. Setting of the margin amount in the present testing method is performed by injecting electrons into the unit cell of the redundant cell before the test, together with storing the data into the unit cell of the memory cell 30.

(2) In normal user data reading, the desired bit line BLx is connected to the sense amplifier 18 by the multiplexer 16. However, in the present test, the multiplexer 16 is controlled in a different manner from normal operation by the test signal.

By performing the above-described control, one of two unit cells to be read (read target cell/complementary cell) can be compared with one unit cell of the redundant memory cell 40 via the bit line common to the memory cell 30. Namely, by using the bit line BLx which is common to the memory cell 30, there is no need to increase the number of the bit lines BLx. As a result, the semiconductor memory device 10 according to the present exemplary embodiment may suppress an increase in a layout area.

Figure 4:
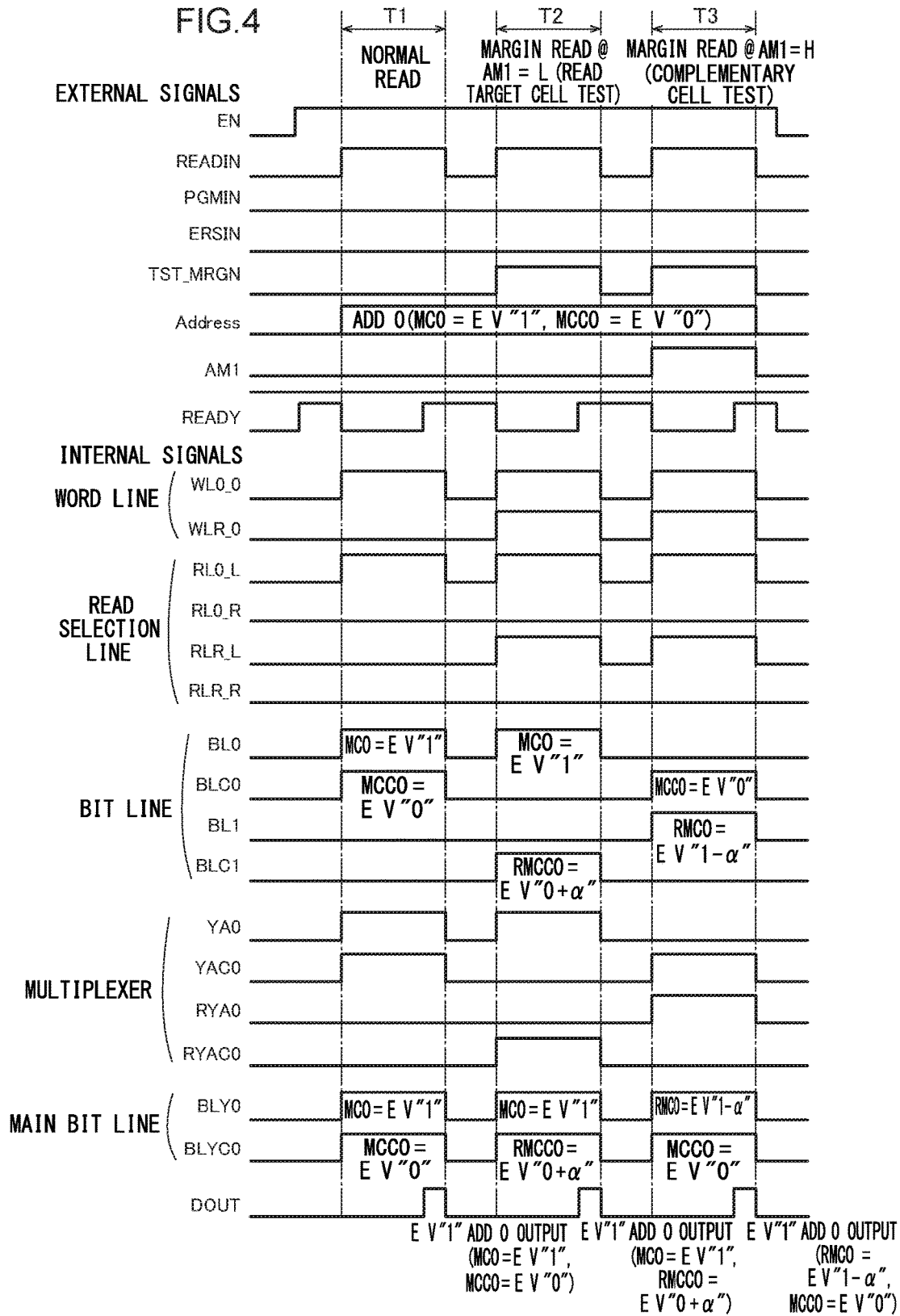
FIG. 4 is a timing chart illustrating operation for testing the semiconductor memory device according to the first exemplary embodiment.

Next, with reference to FIGS. 2 and 4, the testing method of the semiconductor memory device according to the present exemplary embodiment will be described in more detail. FIG. 4 illustrates, in the operation margin test according to the present testing method, a normal read that is executed in normal read operation (executed at the time indicated by T1 in FIG. 4), a margin read @ AM1=L that is read operation at the read target cell side (executed at the time indicated by T2 in FIG. 4), and a margin read @ AM1=H that is read operation at the complementary cell side (executed at the time indicated by T3 in FIG. 4). In addition, FIG. 4 illustrates changes of external signals (same as external signals illustrated in FIG. 1) and internal signals accompanying the above read operations. The internal signals are signals generated on the lines illustrated in FIG. 2 and include signals generated in the following lines. The lines are the word lines (WL0_0, WLR_0), the read selection lines (RL0_L, RL0_R, RLR_L, RLR_R), the bit lines (BL0, BLC0, BL1, BLC1), the multiplexers (YA0, YAC0, RYA0, RYAC0), the main bit lines (BLY0, BLYC0), and the output line (DOUT).

In FIG. 2, the main external signals operate as follows. The signal <EN> is set to a high level (hereinafter referred to as "H") so that the device selection becomes valid in a section including the times T1, T2, and T3. The signal <READIN> is set to H to execute read operation at each of the times T1, T2, and T3. A signal <TST_MRGN> is set to H so that the test is executed at times T2 and T3. The signal <AM1> is set to a low level (hereinafter referred to as "L") so that a test of the read target cell is performed at time T2, and is set to H so that a test of the complementary cell is performed at time T3.

In FIG. 2, a case will be described where the operation margin test is performed to the memory cell 30-1 in which data is written. In the present exemplary embodiment, the redundant memory cell corresponding to the memory cell 30-1 is the redundant memory cell 40-2. The redundant memory cell of the memory cell 30-2 when performing the operation margin test is the redundant memory cell 40-1. Namely, the redundant memory cell 40 of the 1 series memory is made to correspond to the memory cell 30 of the 0 series memory, and the redundant memory cell 40 of the 0 series memory is made to correspond to the memory cell 30 of the 1 series memory. This is because, in the present exemplary embodiment, a case is assumed in which a defect occurs in a part of the memory cell 30 of the 0 series memory, for example, and the part is replaced with the redundant memory cell 40-1. In this case, it is necessary to commonly use the bit lines BL0 and BLC0 of the 0 series memory, and the bit lines BL1 and BLC1 of the 1 series memory. In the present exemplary embodiment, the multiplexer 16 is used for switching the above.

As illustrated in FIG. 2, in this example, a cell MC0 (read target cell, corresponding to the transistor T1) of the memory cell 30-1 is in the state of the expected value EV 1, and a cell MCC0 (complementary cell, corresponding to the transistor T5) is in the state of the expected value EV 0. Note that, in the drawings, "expected value" is reffered to as "EV". In the present exemplary embodiment, the current flowing through the bit line BLx corresponding to the expected value 0 is about 0.1 µA, and the current flowing through the bit line BLx corresponding to the expected value 1 is about 10 µA. Note that current values flowing corresponding to the respective expected values 0 and 1 are not limited to these values, and may be, for example, about a few µA for the expected value 0 and about a few tens of µA for the expected value 1.

With reference to FIG. 4, the normal read will be described first. As illustrated in FIG. 4, <EN>=H, <READIN>=H, and <TST_MRGN>=L are set for the normal read. In accordance with an address (ADD 0) input, a signal of the word line becomes <WL0_0>=H, and a signal of the read selection line becomes <RL0_L>=H. Note that, in the drawings, "address" is reffered to as "ADD". Then, a signal corresponding to the expected value EV 1 by the cell MC0 is transmitted to the bit line BL0, and a signal corresponding to the expected value EV 0 by the cell MCC0 is transmitted to the bit line BLC0. Further, the signal lines YA0 and YAC0 are selected by the multiplexer 16, and the signal corresponding to the expected value EV 1 is transmitted to the main bit line BLY0, and the signal corresponding to the expected value EV 0 is transmitted to the main bit line BLYC0. The signal (current signal) corresponding to the expected value EV 0 and the signal (current signal) corresponding to the expected value EV 1 are compared with each other by the sense amplifier 18-1 and the expected value determination is performed, and a determination result is output as the output signal <DOUT>. FIG. 4 illustrates a state in which the expected value EV 1 is output to the output terminal DOUT (namely, a normal state).

Next, the margin read @ AM1=L will be described. In the present exemplary embodiment, as illustrated in FIG. 2, a cell RMC0 (corresponding to the transistor T1) of the redundant memory cell 40-2 is set to an expected value EV (1−α), and a cell RMCC0 (corresponding to the transistor T5) is set to an expected value EV (0+α). As described above, α is the margin amount, and the expected value EV (1−α) indicates the expected value EV 1 in anticipation of the margin for comparison with the expected value EV 0. Namely, for example, the current value of the expected value EV 1 is set to (10−α) µA with respect to a standard value 10 µA. In addition, the expected value EV (0+α) indicates the expected value EV 0 in anticipation of the margin for comparison with the expected value EV 1. Namely, for example, the current value of the expected value EV 0 is set to (0.1+α) µA with respect to a standard value 0.1 µA. A value of α is, for example, 3 µA. However, it is unnecessary to set the margin amount to the same value between the expected values EV 1 and 0, such as the expected value (1−α) and the expected value (0+α), and different values may be used, such as the expected value EV (1−α) and the expected value EV (0+β).

As illustrated in FIG. 4, in the margin read@AM1=L, <EN>=H, <READIN>=H, <TST_MRGN>=H, and <AM1>=L are set for the margin read@AM1=L. Setting by the signal <AM1> is performed as follows. In the case of <AM1>=L, selection is made such that comparison is executed between the read target cell (MC0) of the memory cell 30-1 and the complementary cell (RMCC0) of the redundant memory cell 40-2 In the case of <AM1>=H, selection is made such that comparison is executed between the complementary cell (MCC0) of the memory cell 30-1 and the read target cell (RMC0) of the redundant memory cell 40-2. Namely, in the case of <AM1>=L, the operation margin test of the read target cell (MC0) of the memory cell 30-1 is executed, and in the case of <AM1>=H, the operation margin test of the complementary cell (MCC0) of the memory cell 30-1 is executed.

As illustrated in FIG. 4, in accordance with the address (ADD 0) input, the signals of the word line become <WL0_0>=H and <WLR_0>=H, and the signals of the read selection line become <RL0_L>=H and <RLR_L>=H. Then, the signal corresponding to the expected value EV 1 by the cell MC0 is transmitted to the bit line BL0, and a signal corresponding to the expected value EV (0+α) by the cell RMCC0 is transmitted to the bit line BLC1. Further, the signal lines YA0 and RYAC0 are selected by the multiplexer 16, and the signal corresponding to the expected value EV 1 is transmitted to the main bit line BLY0, and the signal corresponding to the expected value EV (0+α) is transmitted to the main bit line BLYC0. The signal (current signal) corresponding to the expected value EV 1 and the signal (current signal) corresponding to the expected value EV (0+α) are compared with each other by the sense amplifier 18-1 and the expected value determination is performed, and a determination result is output as the output signal <DOUT>. FIG. 4 illustrates a state in which the expected value EV 1 is output to the output terminal DOUT (namely, a normal state).

Next, the margin read @ AM1=H will be described. As illustrated in FIG. 4, in the margin read@AM1=H, <EN>=H, <READIN>=H, <TST_MRGN>=H, and <AM1>=H are set for the margin read @ AM1=H. In the margin read @ AM1=H, as described above, the expected value EV 0 of the cell MCC0 of the memory cell 30-1 and the expected value EV (1−α) of the cell RMC0 of the redundant memory cell 40-2 are compared with each other. Namely, the operation margin test of the complementary cell of the memory cell 30-1 is executed.

As illustrated in FIG. 4, in accordance with the address (ADD 0) input, the signals of the word line become <WL0_0>=H and <WLR_0>=H, and the signals of the read selection line become <RL0_L>=H and <RLR_L>=H. Then, the signal corresponding to the expected value EV 0 by the cell MCC0 is transmitted to the bit line BLC0, and a signal corresponding to the expected value EV (1−α) by the cell RMC0 is transmitted to the bit line BL1. Further, the signal lines YAC0 and RYA0 are selected by the multiplexer 16, and the signal corresponding to the expected value EV (1−α) by the cell RMC0 is transmitted to the main bit line BLY0, and the signal corresponding to the expected value EV 0 by the cell MCC0 is transmitted to the main bit line BLYC0. The signal (current signal) corresponding to the expected value EV (1−α) and the signal (current signal) corresponding to the expected value EV 0 are compared by the sense amplifier 18-1, the expected value determination is performed, and a determination result is output as the output signal <DOUT>. FIG. 4 illustrates a state in which the expected value EV 1 is output to the output terminal DOUT (namely, a normal state).

Hereinafter, the details of the operation margin test according to the test described above will be summarized.
(1) Configuration In the semiconductor memory that stores data using two unit cells, the following configuration is adopted to test the read operation margin.

[a] In addition to the memory cell storing user data, the redundant memory cell for the test is provided.

[b] The expected value determination of the data of the redundant memory cell that is the comparison target is performed via the bit line common to the memory cell. Due thereto, a configuration is made to generate a decode signal in which logic conversion is applied by the test signal TEST_MAGN and the selection signal AM1.
(2) Setting With the address of the memory cell 30, the test signal TEST_MAGN, and the selection signal AM1, setting in the operation margin test is performed as follows.

[a] In addition to the read target cell and the complementary cell of the memory cell 30, the complementary cell and the read target cell of the redundant memory cell 40 are selected.

[b] In the case of reading the redundant memory cell 40, the multiplexer 16 is switched in accordance with the test signal and the selection signal, such that reading is possible via the bit line (BLx) common to the memory cell 30.
(3) Function As a function of the semiconductor memory device and the testing method of the semiconductor memory device according to the present exemplary embodiment including the above configuration, the read operation margin test of the semiconductor memory device may be performed in a quantitative manner with high accuracy, by freely changing the margin amount while minimizing the increase in the layout area of the memory cell block. As a result, accuracy of sorting in a wafer stage of the semiconductor memory device according to the present exemplary embodiment or accuracy of sorting after assembly may be improved, and further, significant reduction in a market failure rate of the semiconductor memory device may be expected.

Second Exemplary Embodiment

Figure 5:
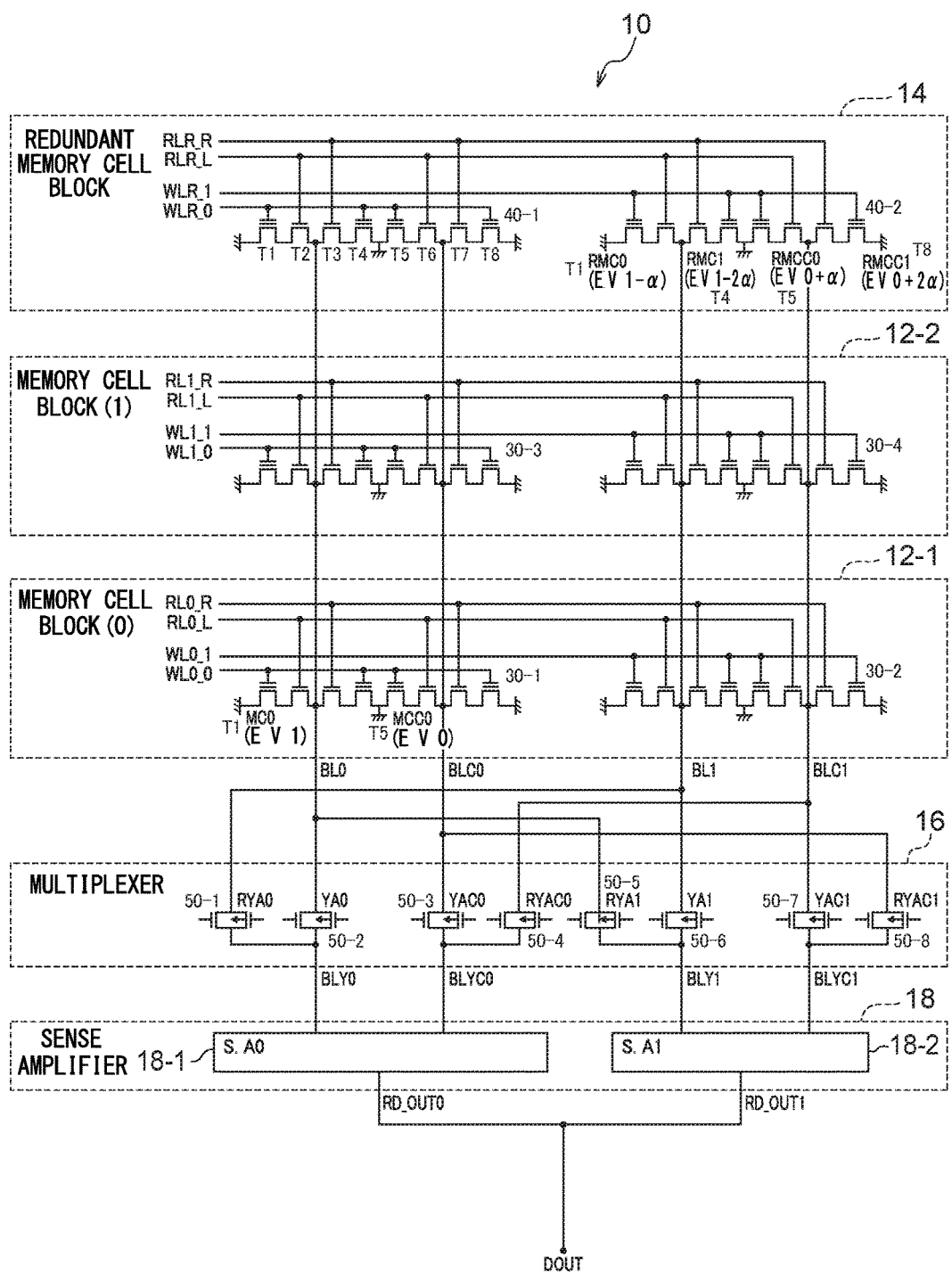
FIG. 5 is a circuit diagram illustrating a configuration of a semiconductor memory device according to a second exemplary embodiment.

With reference to FIG. 5, a semiconductor memory device and a testing method of the semiconductor memory device according to a present exemplary embodiment will be described. In the present exemplary embodiment, a unit cell of another bit of the 2-bit configuration redundant memory cell 40 for the operation margin test according to the above-described exemplary embodiment (in the present exemplary embodiment, the redundant memory cell 40-2 is used as in the above-described exemplary embodiment) is also used for the operation margin test. Namely, in the first exemplary embodiment, the operation margin test is performed using the 0 series memory by the cell RMC0 and the cell RMCC0 of the redundant memory cell 40-2. On the other hand, in the present exemplary embodiment, in addition to the 0 series memory, as illustrated in FIG. 5, the 1 series memory by cells RMC1 and RMCC1 is also used for the operation margin test.

As illustrated in FIG. 5, in the present exemplary embodiment, the cell RMC1 is set such that a current corresponding to the expected value EV (1−2α) flows, and the cell RMCC1 is set such that a current corresponding to the expected value EV (0+2α) flows. Similarly to the first exemplary embodiment, the cell RMC0 is set such that a current corresponding to the expected value EV (1−α) flows, and the cell RMCC0 is set such that a current corresponding to the expected value EV (0+α) flows. Namely, in the testing method of the semiconductor memory device according to the present exemplary embodiment, choices are increased of the state of the redundant memory cell 40 to be compared in the read operation margin test as compared with the above-described exemplary embodiment, and the operation margin test is possible in which the margin amount is doubled.

In the present exemplary embodiment, by switching a decoding destination, the unit cell of a margin α and the unit cell of a margin 2α can be switched and freely set. Namely, in the present exemplary embodiment, in the case of performing a read operation margin test of the memory cell 30, a plurality of margin amounts is set for a plurality of unit cells in the redundant memory cell 40, and the margin amounts are selected by decoding by the control circuit 22. By setting margins α, 2α, 3α, . . . , and the like, for the plurality of unit cells, the margin test can be performed with various standards. Therefore, according to the semiconductor memory device and the testing method of the semiconductor memory device according to the present exemplary embodiment, even in a case in which the standard of the margin amount varies in accordance with, for example, the use of the semiconductor memory device according to the present exemplary embodiment, the test standard according to the use can be freely set.

Note that, in the above-described exemplary embodiments, cases in which the comparison target is set in the 1 series redundant memory cell 40 when performing the test of the 0 series memory cell 30, have been described. However, the present disclosure is not limited thereto. The comparison target may be set in the 0 series redundant memory cell 40 when performing the test of the 0 series memory cell 30. In this case, for example, when performing the test of the memory cell 30-1, the comparison target is set in the redundant memory cell 40-1. Further, in this case, since the bit lines (BL0, BLC0) are common, there is no need to perform switching, and therefore the multiplexer 16 may be omitted.

What is claimed is:

1. A semiconductor memory device comprising:
a memory cell including a first cell that stores data, and a second cell that stores complementary data that is complementary to the data;
a redundant memory cell including a third cell that stores margined complementary data in which a margin is added to the complementary data, and a fourth cell that stores margined data in which a margin is added to the data; and a controller that causes the data and the margined complementary data to be compared and a test of the first cell to be executed, and the complementary data and the margined data to be compared and a test of the second cell to be executed.

2. The semiconductor memory device according to claim 1, further comprising:

a first selector that outputs the data stored in the first cell to a first output line and outputs the complementary data stored in the second cell to a second output line;

a second selector that outputs the margined complementary data stored in the third cell to the first output line and outputs the margined data stored in the fourth cell to the second output line; and a comparator that compares a signal output to the first output line and a signal output to the second output line, wherein the controller controls the first selector and the second selector such that the data and the margined complementary data are input to the comparator to execute the test of the first cell, and controls the first selector and the second selector such that the complementary data and the margined data are input to the comparator to execute the test of the second cell.

3. The semiconductor memory device according to claim 1, further comprising:

a first selector that outputs the data stored in the first cell to a first output line and outputs the complementary data stored in the second cell to a second output line;

a second selector that outputs the margined complementary data stored in the third cell to a third output line and outputs the margined data stored in the fourth cell to a fourth output line;

a third selector that selects one of the first output line and the third output line and selects one of the second output line and the fourth output line; and a comparator that compares signals output to the respective two output lines selected by the third selector, wherein the controller controls the first selector, the second selector, and the third selector such that the data and the margined complementary data are input to the comparator to execute the test of the first cell, and controls the first selector, the second selector, and the third selector such that the complementary data and the margined data are input to the comparator to execute the test of the second cell.

4. The semiconductor memory device according to claim 1, further comprising:

a plurality of memory cells; and a plurality of redundant memory cells that respectively correspond to the plurality of memory cells, wherein a margin amount of the margined complementary data and a margin amount of the margined data differ for each of the plurality of redundant memory cells.

5. A testing method of a semiconductor memory device, the semiconductor memory device including: a memory cell including a first cell that stores data and a second cell that stores complementary data that is complementary to the data; and a redundant memory cell including a third cell that stores margined complementary data in which a margin is added to the complementary data, and a fourth cell that stores margined data in which a margin is added to the data, the method comprising:

causing, by a controller, the data and the margined complementary data to be compared and a test of the first cell to be executed, and the complementary data and the margined data to be compared and a test of the second cell to be executed.

* * * * *